US007504848B2

(12) United States Patent
Jeon

(10) Patent No.: US 7,504,848 B2
(45) Date of Patent: Mar. 17, 2009

(54) PANEL AND TEST METHOD FOR DISPLAY DEVICE

(75) Inventor: Sang-Jin Jeon, Suwon-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/857,889

(22) Filed: Sep. 19, 2007

(65) Prior Publication Data

US 2008/0007287 A1 Jan. 10, 2008

Related U.S. Application Data

(63) Continuation of application No. 11/217,591, filed on Aug. 31, 2005, now Pat. No. 7,288,955.

(30) Foreign Application Priority Data

Nov. 16, 2004 (KR) ..................... 10-2004-0093563

(51) Int. Cl.
*G01R 31/00* (2006.01)

(52) U.S. Cl. ..................................................... 324/770

(58) Field of Classification Search .................. 324/770
See application file for complete search history.

(56) References Cited

U.S. PATENT DOCUMENTS 4,820,222 A * 4/1989 Holmberg et al. .............. 445/3
4,840,459 A * 6/1989 Strong ......................... 349/55
5,537,054 A * 7/1996 Suzuki et al. ............... 324/770
5,546,013 A * 8/1996 Ichioka et al. .............. 324/770
5,576,730 A * 11/1996 Shimada et al. ............... 345/98
5,657,139 A * 8/1997 Hayashi ........................ 349/40
5,767,929 A * 6/1998 Yachi et al. ................... 349/40
5,859,679 A * 1/1999 Song ........................... 349/54
6,031,247 A * 2/2000 Lee ............................ 257/57
6,111,558 A * 8/2000 Jeung et al. ................... 345/93
6,392,719 B2 5/2002 Kim
6,429,908 B1 * 8/2002 Lim ............................ 349/54
6,753,935 B2 * 6/2004 Wu ............................. 349/54

* cited by examiner

*Primary Examiner*—Ha Tran T Nguyen
*Assistant Examiner*—Richard Isla Rodas
(74) *Attorney, Agent, or Firm*—MacPherson Kwok Chen & Heid LLP; Mark A. Pellegrini

(57) ABSTRACT

A panel for a display device includes a display area and a peripheral area. The display area comprises a plurality of pixels each comprising a switching element and gate lines and data lines connected to the pixels. The peripheral area comprises a plurality of gate driving integrated circuit regions, a plurality of data driving integrated circuit regions, a plurality of repair lines disposed along the edge of the panel, connecting pads connected to both ends of the repair lines, a test line connected to at least one connecting pad, and a test pad connected to the test line. A test method for detecting disconnection of the data lines is also provided.

9 Claims, 6 Drawing Sheets

$V_C = V_{AT}$ $V_c = V_{AT} + V_{com}$

PANEL AND TEST METHOD FOR DISPLAY DEVICE

CROSS-REFERENCE TO RELATED APPLICATION

This application is a Continuation Application of U.S. patent application Ser. No. 11/217,591 filed on Aug. 31, 2005, now U.S. Pat. No. 7,288,955 which claims priority to corresponding Korean Patent Application No. 10-2004-0093563 filed in the Korean Intellectual Property Office, Republic of Korea, on Nov. 16, 2004, all of which are hereby incorporated by reference.

BACKGROUND OF THE INVENTION (a) Field of the Invention

The present invention relates to a panel and a test method for a display device.

(b) Description of Related Art

Recently, flat panel displays such as organic light emitting diode ("OLED") displays, plasma display panels ("PDPs"), and liquid crystal displays ("LCDs") have been developed which replace displays employing heavy and large cathode ray tubes ("CRTs").

PDPs are devices which display characters or images using plasma generated by a gas-discharge. OLED displays are devices which display characters or images by applying an electric field to specific light-emitting organics or high molecule materials. LCDs are devices which display images by applying an electric field to a liquid crystal layer disposed between two panels and regulating the strength of the electric field to adjust a transmittance of light passing through the liquid crystal layer.

Among the flat panel displays, as examples, the LCD and the OLED display each include: a lower panel provided with pixels including switching elements and display signal lines; an upper panel facing the lower panel provided with color filters; and a plurality of circuitry elements.

When the display signal lines become disconnected in the process of manufacturing a display device, the disconnection thereof can be detected via predetermined tests. Such tests include an array test, a visual inspection (VI) test, a gross test, a module test, and so on.

The array test determines the disconnection of the display signal lines by applying predetermined voltages and detecting whether or not output voltages are generated before a mother glass is divided into separate cells. The VI test determines the disconnection of the display signal lines by applying predetermined voltages and viewing the panels after the mother glass is divided into separate cells. The gross test determines image quality and disconnection of the display signal lines by applying predetermined voltages and viewing display states of a screen after the lower panel and upper panel have been combined, but before driving circuits are mounted on the screen. The module test determines an optimum operation of the driving circuits after the driving circuits are mounted on the screen.

Unfortunately, when data lines of the display signal lines are disconnected in the bottom right and bottom left regions of the lower panel, it can be difficult to detect such disconnection using the array test.

SUMMARY OF THE INVENTION

An object of the present invention is to provide a panel and a test method for a display device that is capable of solving the above-identified problem.

A panel for a display device according to an embodiment of the present invention includes a display area and a peripheral area. The display area may include a plurality of pixels each comprising a switching element and gate lines and data lines connected to the pixels. The peripheral area may include a plurality of gate driving integrated circuit regions, a plurality of data driving integrated circuit regions, a plurality of repair lines disposed along an edge of the panel, connecting pads connected to first and second ends of the repair lines, a test line connected to at least one connecting pad, and a test pad connected to the test line.

The panel may further include an intersecting repair line intersecting end portions of the data lines.

The test line may be connected to a connecting pad connected to the intersecting repair line.

The test pad is preferably applied with a predetermined voltage which may be a common voltage.

The connecting pad may be formed in the gate driving integrated circuit regions and the data driving integrated circuit regions, and the test pad may be formed outside the gate driving integrated circuit regions.

According to another embodiment of the present invention, a test method is provided for a display device which includes: a plurality of pixels each comprising a switching element; gate lines and data lines connected to the pixels; a plurality of gate driving integrated circuit regions; a plurality of data driving integrated circuit regions; a plurality of repair lines disposed along an edge of the panel; connecting pads connected to first and second ends of the repair lines; a test line connected to at least one connecting pad; and a test pad connected to the test line. The test method of such an embodiment includes applying a first test signal to the data lines and applying a second test signal to the data lines via the test pad.

The display device may further include an intersecting repair line intersecting end portions of the data lines.

The test line of the display device may be connected to a connecting pad connected to the intersecting repair line.

The first test signal of the test method may be an array test voltage and the second test signal may be a common voltage.

BRIEF DESCRIPTION OF THE DRAWINGS

The present invention will become more apparent by describing preferred embodiments thereof in detail with reference to the accompanying drawings, in which.

DETAILED DESCRIPTION OF EMBODIMENTS

Figure 1:
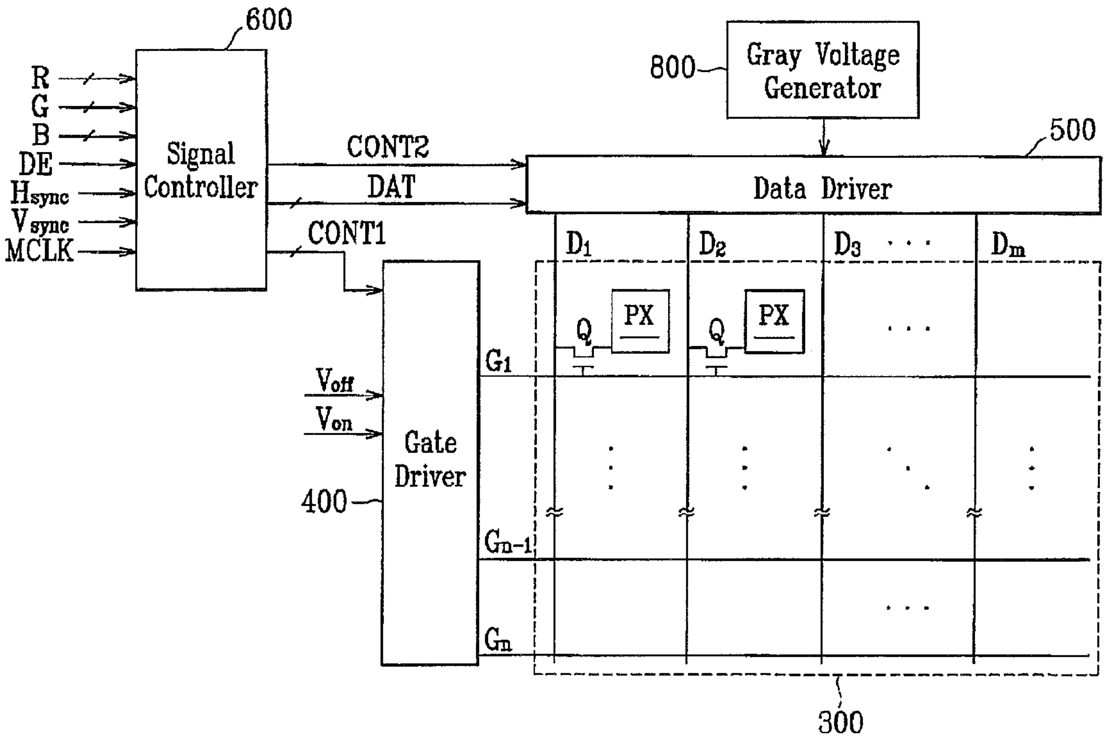
FIG. 1 is a block diagram of a display device according to an exemplary embodiment of the present invention.

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

Figure 2:
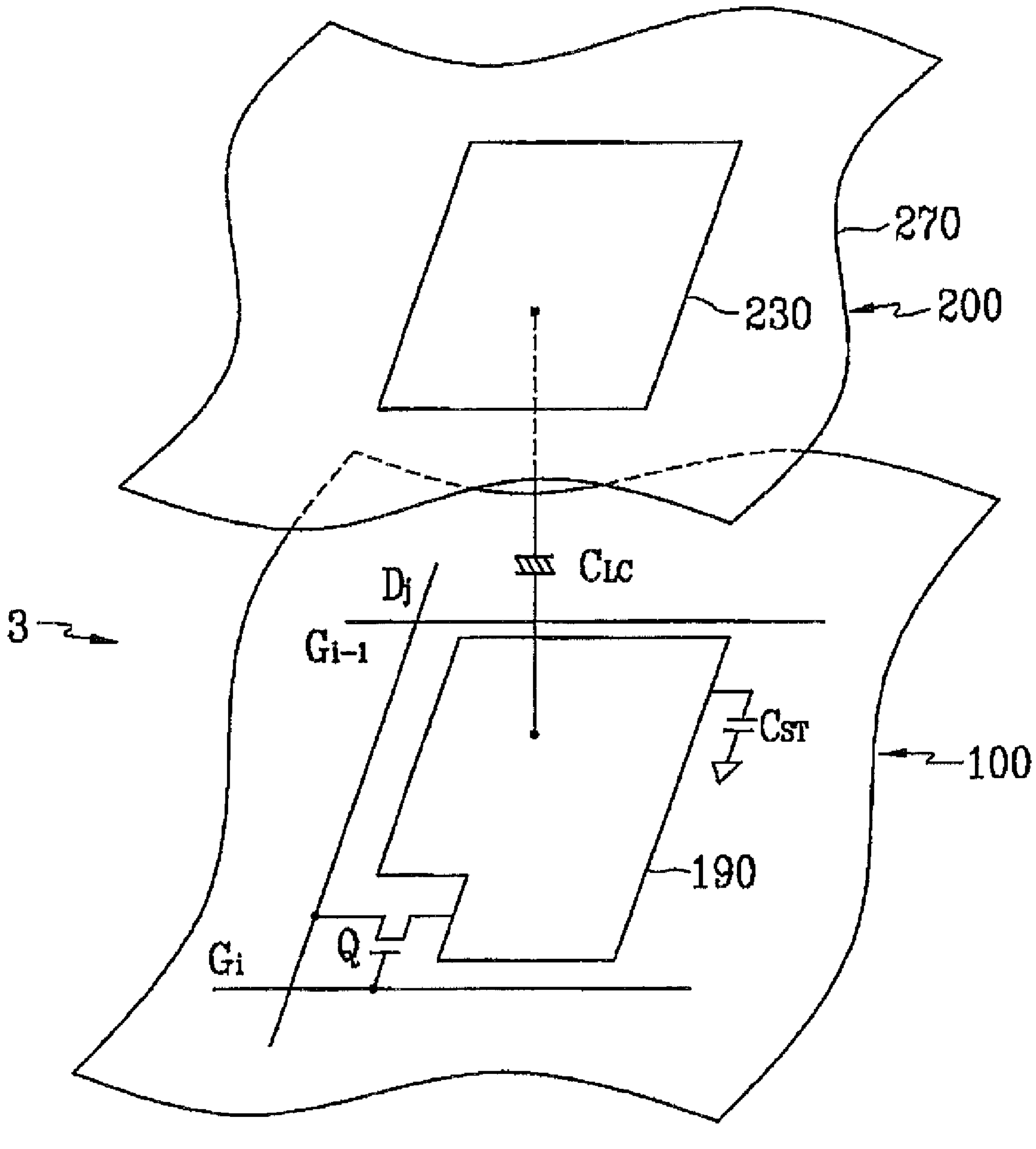
FIG. 2 illustrates a structure and an equivalent circuit diagram of a pixel of a liquid crystal display (LCD) according to an exemplary embodiment of the present invention.

FIG. 1 is a block diagram of a display device according to an embodiment of the present invention, and FIG. 2 illustrates a structure and an equivalent circuit diagram of a pixel of an LCD according to an exemplary embodiment of the present invention.

Referring to FIG. 1, a display device according to an exemplary embodiment of the present invention includes a panel assembly 300, a gate driver 400 and a data driver 500 connected thereto, a gray voltage generator 800 connected to the data driver 500, and a signal controller 600 that controls the above-described elements.

The panel assembly 300 includes a plurality of display signal lines $G_1$-$G_n$ and $D_1$-$D_m$, and a plurality of pixels connected to the display signal lines $G_1$-$G_n$ and $D_1$-$D_m$ arranged substantially in a matrix structure. The panel assembly 300 includes a lower panel 100 and an upper panel 200.

The display signal lines $G_1$-$G_n$ and $D_1$-$D_m$ are provided on the lower panel 100, and include gate lines $G_1$-$G_n$ which transmitgate signals (called scanning signals) and data lines $D_1$-$D_m$ which transmit data signals. The gate lines $G_1$-$G_n$ extend substantially in a row direction and are substantially parallel to each other, while the data lines $D_1$-$D_m$ extend substantially in a column direction and are substantially parallel to each other.

Each pixel includes a switching element Q connected to one of the gate lines $G_1$-$G_n$ and one of the data lines $D_1$-$D_m$, and pixel circuits PX connected to the switching element Q. The switching element Q is provided on the lower panel 100 and has three terminals: a control terminal connected to one of the gate lines $G_1$-$G_n$; an input terminal connected to one of the data lines $D_1$-$D_m$; and an output terminal connected to the pixel circuit PX.

In an active matrix LCD, which is an example of a flat panel display device, the panel assembly 300 includes the lower panel 100, the upper panel 200, and a liquid crystal (LC) layer 3 disposed between the lower and upper panels 100 and 200. The display signal lines $G_1$-$G_n$ and $D_1$-$D_m$, and the switching elements Q are provided on the lower panel 100. Each pixel circuit PX includes an LC capacitor $C_{LC}$ and a storage capacitor $C_{ST}$ that are connected in parallel with the switching element Q. The storage capacitor $C_{ST}$ may be omitted if the storage capacitor $C_{ST}$ is not needed.

The LC capacitor $C_{LC}$ includes a pixel electrode 190 on the lower panel 100, a common electrode 270 on the upper panel 200, and the LC layer 3 as a dielectric between the pixel and common electrodes 190 and 270. The pixel electrode 190 is connected to the switching element Q, and the common electrode 270 covers the entire surface of the upper panel 200 and is supplied with a common voltage Vcom. Alternatively, both the pixel electrode 190 and the common electrode 270, which have shapes of bars or stripes, are provided on the lower panel 100.

The storage capacitor $C_{ST}$ is an auxiliary capacitor for the LC capacitor $C_{LC}$. The storage capacitor $C_{ST}$ includes the pixel electrode 190 and a separate signal line (not shown), which is provided on the lower panel 100 and overlaps the pixel electrode 190 with an insulator disposed between the pixel electrode 190 and the separate signal line. The storage capacitor $C_{ST}$ is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 with an insulator disposed between the pixel electrode 190 and the previous gate line.

For a color display, each pixel uniquely represents one of three primary colors such as red, green, and blue colors (spatial division), or sequentially represents the three primary colors in time (temporal division), thereby obtaining a desired color. FIG. 2 shows an example of the spatial division in which each pixel includes a color filter 230 representing one of the three primary colors in an area of the upper panel 200 facing the pixel electrode 190. Alternatively, the color filter 230 is provided on or under the pixel electrode 190 on the lower panel 100.

A pair of polarizers (not shown) for polarizing light are attached on outer surfaces of the lower and upper panels 100 and 200 of the panel assembly 300.

Referring back to FIG. 1, a gray voltage generator 800 generates one set or two sets of gray voltages related to a transmittance of the pixels. When two sets of the gray voltages are generated, the gray voltages in one set have a positive polarity with respect to the common voltage Vcom, while the gray voltages in the other set have a negative polarity with respect to the common voltage Vcom.

The gate driver 400 includes a plurality of driving integrated circuits (ICs), and it synthesizes the gate-on voltage Von and the gate-off voltage Voff to generate gate signals for application to the gate lines $G_1$-$G_n$. In one embodiment, the gate driver is a shift register which includes a plurality of stages in a line.

The data driver 500 also includes a plurality of driving ICs and is connected to the data lines $D_1$-$D_m$ of the panel assembly 300. It applies data voltages selected from the gray voltages supplied from the gray voltage generator 800 to the data lines $D_1$-$D_m$.

The signal controller 600 controls the gate driver 400 and the data driver 500.

Now, the operation of the display device will be described in detail referring to FIG. 1.

The signal controller 600 is supplied with image signals R, G, and B and input control signals controlling the display of the image signals R, G, and B. The input control signals include, for example, a vertical synchronization signal Vsync, a horizontal synchronization signal Hsync, a main clock MCLK, and a data enable signal DE, from an external graphic controller (not shown). The signal controller 600 generates gate control signals CONT1 and data control signals CONT2 and processes the image signals R, G, and B to be suitable for the operation of the panel assembly 300 in response to the input control signals. Thereafter, the signal controller 600 provides the gate control signals CONT1 to the gate driver 400, and the processed image signals DAT and the data control signals CONT2 to the data driver 500.

The gate control signals CONT1 include a vertical synchronization start signal STV for informing the gate driver of a start of a frame, a gate clock signal CPV for controlling an output time of the gate-on voltage Von, and an output enable signal OE for defining a width of the gate-on voltage Von.

The data control signals CONT2 include a horizontal synchronization start signal STH for informing the data driver 500 of a start of a horizontal period, a load signal LOAD or TP for instructing the data driver 500 to apply the appropriate data voltages to the data lines $D_1$-$D_m$, and a data clock signal HCLK. The data control signals CONT2 may further include an inversion control signal RVS for reversing the polarity of the data voltages (with respect to the common voltage Vcom).

The data driver 500 receives the processed image signals DAT for a pixel row from the signal controller 600, and converts the processed image signals DAT into the analogue data voltages selected from the gray voltages supplied from the gray voltage generator 800 in response to the data control signals CONT2 from the signal controller 600.

In response to the gate control signals CONT1 from the signal controller 600, the gate driver 400 applies the gate-on voltage Von to the gate lines $G_1$-$G_n$, thereby turning on the switching elements Q connected to the gate lines $G_1$-$G_n$.

The data driver 500 applies the data voltages to corresponding data lines $D_1$-$D_m$ for a turn-on time of the switching elements Q (which is called "one horizontal period" or "1H" and equals one period of the horizontal synchronization signal Hsync, the data enable signal DE, and the gate clock signal CPV). The data voltages in turn are supplied to corresponding pixels via the turned-on switching elements Q.

The difference between the data voltage and the common voltage Vcom applied to a pixel is expressed as a charged voltage of the LC capacitor $C_{LC}$, i.e., a pixel voltage. The liquid crystal molecules have orientations depending on a magnitude of the pixel voltage, and the orientations determine a polarization of light passing through the LC capacitor $C_{LC}$. The polarizers convert light polarization into light transmittance.

By repeating the above-described procedure, all gate lines $G_1$-$G_n$ are sequentially supplied with the gate-on voltage Von during a frame, thereby applying the data voltages to all pixels. In the case of the LCD shown in FIG. 1, when a next frame starts after finishing one frame, the inversion control signal RVS applied to the data driver 500 is controlled such that a polarity of the data voltages is reversed ("frame inversion"). The inversion control signal RVS may be controlled such that the polarity of the data voltages flowing in a data line in one frame is reversed (e.g.: "row inversion", "dot inversion"), or the polarity of the data voltages in one packet is reversed (e.g.: "column inversion", "dot inversion").

A panel and a test method for a display device according to embodiments of the present invention will now be described with reference to FIGS. 3-5B.

Figure 3:
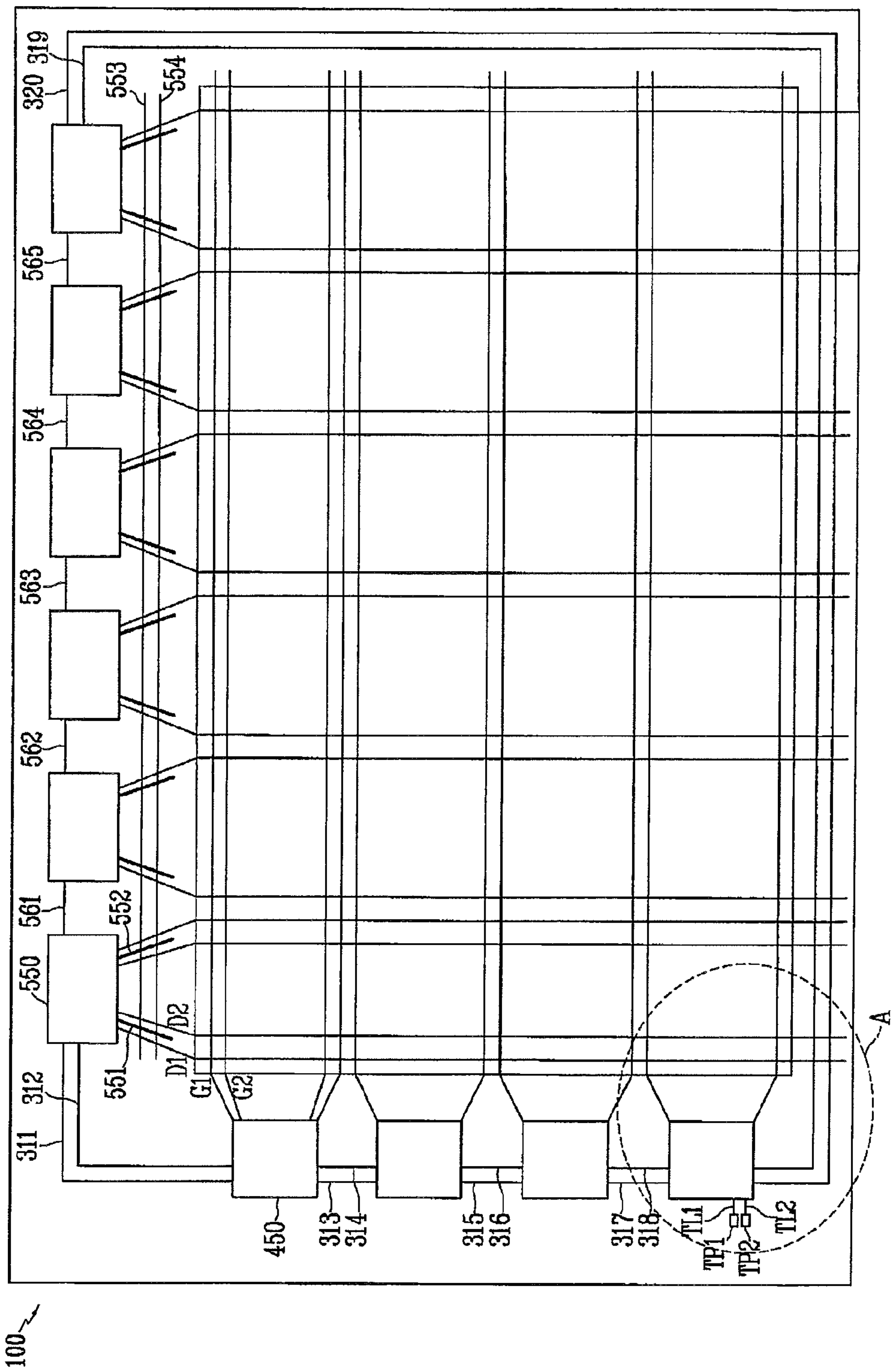
FIG. 3 is a schematic layout view of a display device according to an exemplary embodiment of the present invention.
Figure 4:
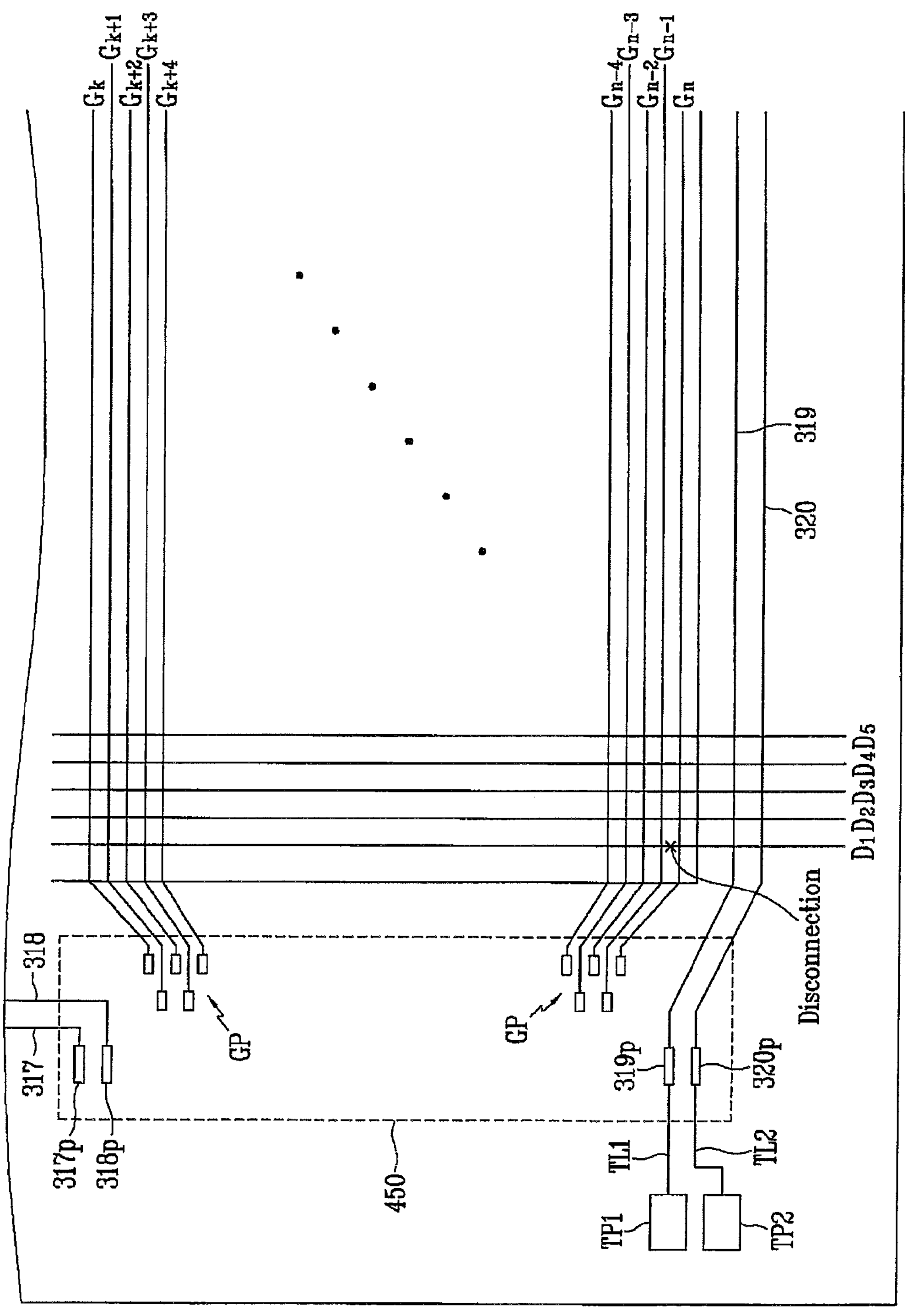
FIG. 4 is an enlarged view of a portion A shown in FIG. 3.
Figure 5A:
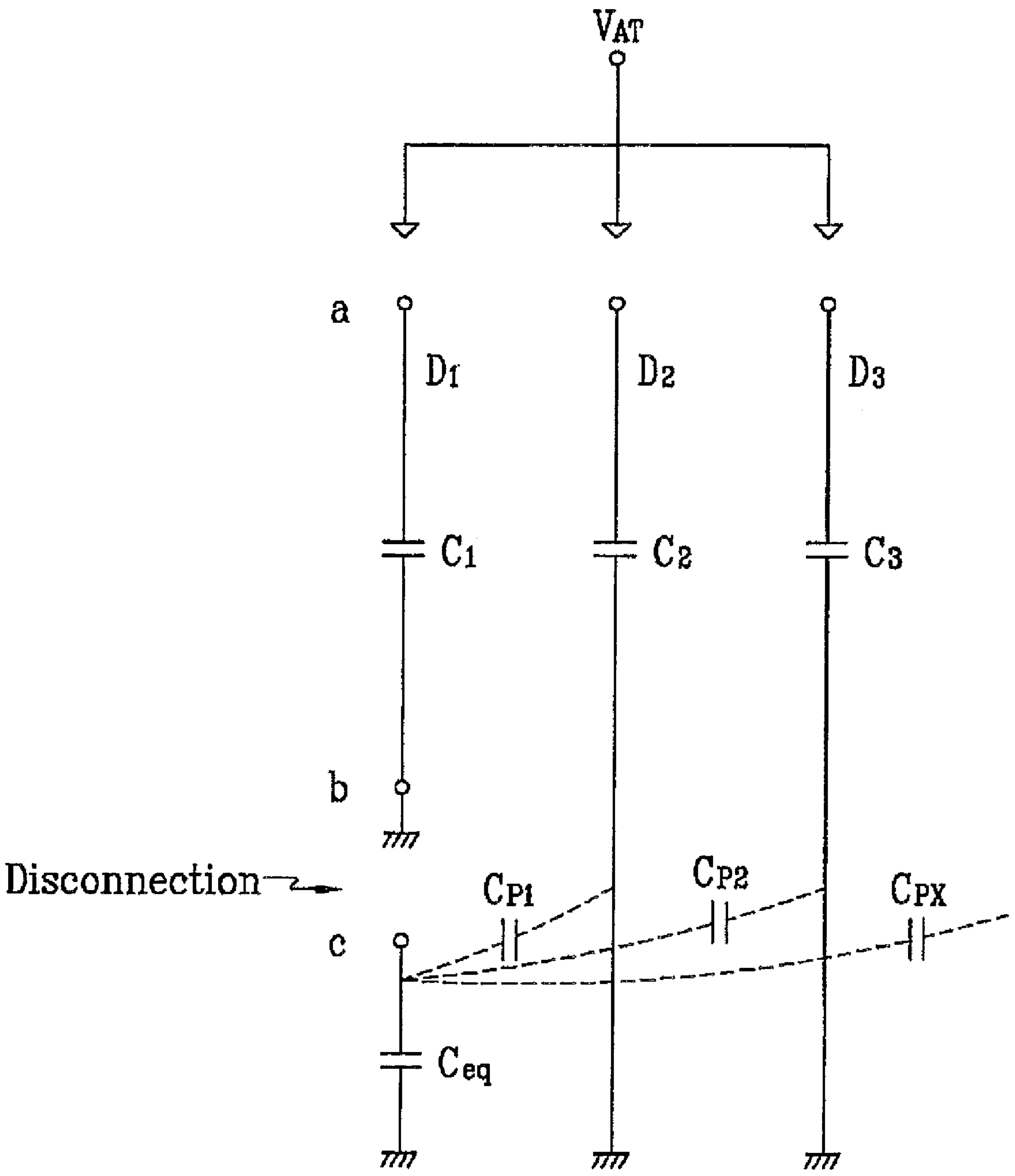
FIGS. 5A and 5B illustrate a test principle of a panel for a display device according to an exemplary embodiment of the present invention.
Figure 5B:
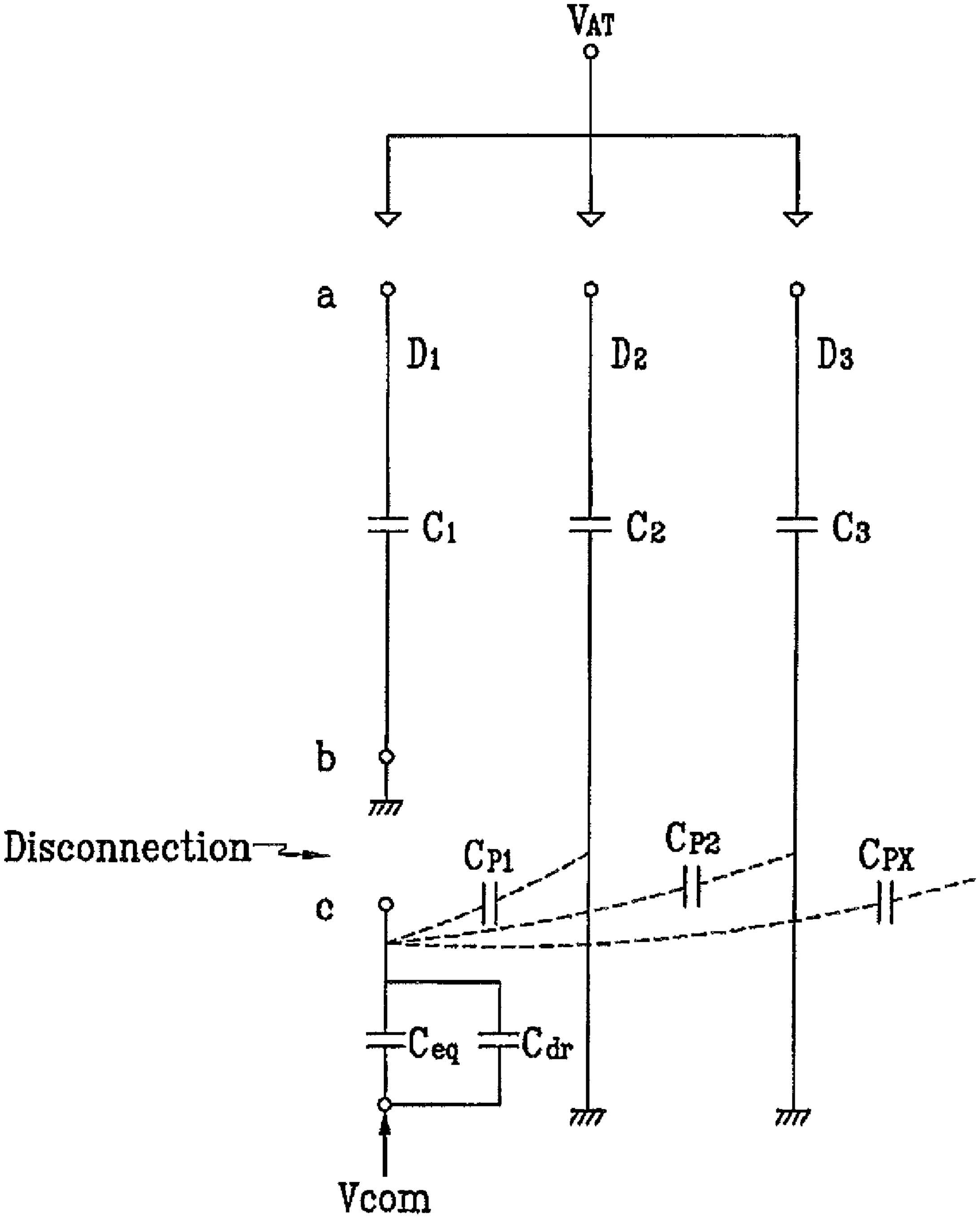

FIG. 3 is a schematic layout view of a display device according to an exemplary embodiment of the present invention. FIG. 4 is an enlarged view of a portion A shown in FIG. 3, and FIGS. 5A and 5B illustrate a test principle of a panel for a display device according to an exemplary embodiment of the present invention.

A panel 100 for a display device according to an exemplary embodiment of the present invention includes a plurality of data driving IC regions 550, a plurality of gate driving IC regions 450, a plurality of repair lines 311-320, 561-565, 553, and 554, test lines TL1 and TL2, and test pads TP1 and TP2.

In this case, the panel 100 is the lower panel 100 in a state prior to combining the upper panel 200 into the lower panel 100.

Additionally, the data driving IC regions 550 and the gate driving IC regions 450 are regions on which data driving ICs and gate driving ICs will be mounted in a later process.

For example, the gate driving IC regions 450 are provided with a plurality of gate pads GP which are connected to the gate lines $G_k$-$G_{k+4}$ and $G_{n-4}$-$G_n$. Likewise, the data driving IC regions 550 are provided with a plurality of data pads (not shown) which are connected to the data lines $D_1$-$D_m$.

The plurality of repair lines 311-321 are disposed with a shape of a ring between the gate driving IC regions 450, between the data driving IC regions 550, and in peripheral areas in which the gate lines $G_1$-$G_n$ and the data lines $D_1$-$D_m$ are not disposed. Additionally, the repair lines 551 and 552 are projected from the regions 550 and are respectively disposed at the left and the right of the regions 550. The repair lines 553 and 554 intersect the repair lines 551 and 552 to extend in a transverse direction.

Additionally, the repair lines 319 and 320 intersect the data lines D1-Dm at the bottom-left of the panel 100. In other words, the repair lines 319 and 320 are formed on a same layer as the gate lines G1-Gn, the data lines D1-Dm are formed thereon, and an insulating layer such as a SiNx is formed therebetween.

The repair lines 311-320, 551, 552, and 561-565 are formed separately, but are connected to each other when the repair is needed. For example, the repair lines 317 and 318 and the repair lines 319 and 320 are connected to each other via pads 317*p*, 318*p*, 319*p*, and 320*p* disposed in the gate driving IC regions 450 and the gate driving ICs mounted later.

A method of testing whether the data lines $D_1$-$D_m$ are disconnected or not will now be described in detail.

The test of disconnection of the data lines $D_1$-$D_m$ is performed by applying an array test voltage VAT to the data lines $D_1$-$D_m$.

As shown in FIGS. 5A and 5B, each of the data lines $D_1$-$D_m$, for example the data lines $D_1$-$D_3$, are represented as capacitors C1-C3 in a circuital view, respectively, and the capacitors C1-C3 charge the applied voltage $V_{AT}$.

In this case, for example, when the bottom of the first data line $D_1$ is disconnected, a node a and a node b are connected and a node c is disconnected. The applied voltage $V_{AT}$ is charged between the nodes a and b, and the disconnected node c also has a voltage equal to the applied voltage $V_{AT}$.

Although voltage $V_{AT}$ is not applied to node c, the voltage at node c follows the applied voltage $V_{AT}$. When node c is in a floating state (i.e. when the bottom portion of data line $D_1$ is disconnected), a capacitor Ceq having a capacitance equal to the parasitic capacitances $C_{p1}$, $C_{p2}$, and $C_{px}$ existing among the data lines $D_1$-$D_m$ is formed at the bottom thereof. $C_{px}$ is the sum of parasitic capacitances attributable to the remaining data lines D4-Dm. As a result of the parasitic capacitances, the voltage at node c can appear to follow the applied voltage $V_{AT}$. The extent of this phenomenon is such that it is difficult to detect disconnection of data lines occurring within about ten pixels in the row direction from the bottom-left and the bottom-right of the panel 100.

A predetermined voltage such as the common voltage Vcom can be applied to the data lines $D_1$-$D_m$ via the one or both of two test pads TP1 and TP2. Then, the common voltage Vcom is applied to the repair lines 319 and 320 and a capacitor Cdr is formed between the data lines $D_1$-$D_m$ intersecting the repair lines 319 and 320. As a result, voltage Vc at the node c increases by the common voltage Vcom. Thus, the node voltage Vc becomes larger than the floating voltage $V_{AT}$ such that it can be discriminated, and thus it can be determined that the portion of the data line exhibiting the voltage increase is disconnected.

Capacitors are formed in the remaining data lines $D_2$-$D_m$ due to application of the common voltage Vcom, but the data lines $D_2$-$D_m$ are not disconnected and therefore are not in a floating state. Thus, the data lines $D_2$-$D_m$ are not affected by the common voltage Vcom and maintain the applied voltage $V_{AT}$ as it is.

Subsequently, when the disconnection is detected, the disconnected line is connected using laser illumination. That is, the repair is not performed using the repair lines 319 and 320. A repair using the repair lines 319 and 320 is possible after mounting the gate driving ICs or the data driving ICs. In contrast, when the disconnection is detected in the array test in advance, the disconnected line is simply connected using laser illumination.

Separate test pads TP1 and TP2 are provided to which a predetermined voltage such as the common voltage is applied. A voltage at the disconnected portion of the data line can therefore be detected which increases the ability to detect the disconnection of data lines in the bottom-left and the bottom-right of the lower panel of a panel assembly. Accordingly, product yield can be further increased.

As described above, when the disconnection of the data lines occurs in the bottom-left and the bottom-right of the panel 100, a separate voltage from the array test voltage is applied thereto to easily detect the disconnection of the data lines.

While the present invention has been described in detail with reference to the preferred embodiments, it will be understood that the invention is not limited to the disclosed embodiments. Other modifications and equivalent arrangements are contemplated by the present disclosure. Accordingly, the scope of the invention is to be limited only by the following claims.

What is claimed is:

1. A panel for a display device comprising a display area and a peripheral area, wherein the display area comprises:

a plurality of pixels each comprising a switching element;

gate lines extended in a first direction and connected to the switching elements; and data lines extended in a second direction and connected to the pixels and connected to the switching elements, and wherein the peripheral area comprises:

a plurality of gate driving integrated circuit regions;

a plurality of data driving integrated circuit regions;

a test pad;

a test line connected to the test pad and extended in the first direction; and a capacitor formed between a disconnected portion of one of the data lines and the test line in response to a first test signal applied to the data lines and second test signal applied to the test pad.

2. The panel of claim 1, further comprising a plurality of repair lines disposed along an edge of the panel; and connecting pads connected to first and second ends of the repair lines.

3. The panel of claim 2, further comprising an intersecting repair line intersecting end portions of the data lines.

4. The panel of claim 3, wherein the test line is connected to a connecting pad connected to the intersecting repair line.

5. The panel of claim 4, wherein the test pad is applied with a predetermined voltage.

6. The panel of claim 5, wherein the predetermined voltage is a common voltage.

7. The panel of claim 6, wherein the connecting pad is formed in the gate driving integrated circuit regions and the data driving integrated circuit regions and the test pad is formed outside the gate driving integrated circuit regions.

8. The panel of claim 2, wherein the test line is connected to at least one connecting pad.

9. The panel of claim 1, wherein the first test signal is applied to the data lines and the second test signal is applied to the test pad such that the disconnected portion of the one of the data lines represents a sum of a voltage associated with the first test signal and a voltage associated with the second test signal.

* * * * *